US006829571B1

(12) United States Patent
Rakel et al.

(10) Patent No.: US 6,829,571 B1
(45) Date of Patent: Dec. 7, 2004

(54) METHOD OF DETERMINING DC MARGIN OF A LATCH

(75) Inventors: Ted Scott Rakel, Fort Collins, CO (US); Douglas S Stirrett, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 937 days.

(21) Appl. No.: 09/595,036

(22) Filed: Jun. 15, 2000

(51) Int. Cl.[7] .............................................. G06F 17/50
(52) U.S. Cl. ............................ 703/15; 703/13; 703/14; 716/5; 716/9; 716/2; 714/814
(58) Field of Search .............................. 703/13, 14, 15; 716/9, 5, 2

(56) References Cited

U.S. PATENT DOCUMENTS

| | | | | |
|---|---|---|---|---|
| 5,359,538 A | * | 10/1994 | Hui et al. ....................... | 716/9 |
| 5,654,898 A | * | 8/1997 | Roetcisoender et al. ....... | 716/9 |
| 5,815,439 A | * | 9/1998 | Korsh et al. ........... | 365/185.24 |
| 5,901,089 A | * | 5/1999 | Korsh et al. ........... | 365/185.24 |
| 6,088,830 A | * | 7/2000 | Blomgren et al. .......... | 714/814 |
| 6,292,766 B1 | * | 9/2001 | Mattos et al. .................. | 703/14 |
| 6,298,468 B1 | * | 10/2001 | Zhen ............................. | 716/2 |
| 6,542,509 B1 | * | 4/2003 | Giroux ....................... | 370/397 |
| 6,591,402 B1 | * | 7/2003 | Chandra et al. ............... | 716/5 |

OTHER PUBLICATIONS

"Fast generation of statistically–based worst–case modeling of on–chip interconnect, N. Chang et al", Computer Design: International Conference on VLSI in Computers and Processors, IEEE 1997.*
"MicroSim PSpice A/D Reference Manual", MicroSim Corporation, Version 8.0, Jun. 1997.*
"A Simulation Program Emphasized on DC Analysis of VLSI Circuits; SAMOC", Y. Jan, IEEE 0–7803–5510–0–5/99, IEEE May 1999.*

* cited by examiner

Primary Examiner—Kevin J. Teska
Assistant Examiner—Fred Ferris

(57) ABSTRACT

DC margin of a latch of a circuit under design is determined by performing three simulations. A simulation is performed to find the trip voltage of the forwarding inverter of the latch. A second simulation is performed to find the one margin of the latch. Lastly, a third simulation is performed to find the zero margin of the latch. During each of the simulations to find the one margin and the zero margin, the worst case input signal path from the various driver circuit elements and signal paths within the circuit under design is determined analytically by accumulating weighted resistance of each of the circuit elements along the signal paths. The weights assigned to the circuit elements are empirically determined based on the topology configuration of each of the circuit elements, e.g., the type circuit element, the signal being passed through the circuit element and whether a threshold voltage drop occurs between the drive circuit element and the pass circuit element.

19 Claims, 7 Drawing Sheets

US 6,829,571 B1

METHOD OF DETERMINING DC MARGIN OF A LATCH

COPYRIGHT NOTICE PURSUANT TO 37 C. F. R.§ 1.17 (e)

A portion of the disclosure of this patent document contains command formats and other computer language listings all of which are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The invention relates to electronic circuits More particularly, the invention relates to simulation and determination of design parameters of an electronic circuit.

BACKGROUND ART

A latch is a circuit element that maintains a particular state between state changing events, i.e., in response to a particular input, and is ubiquitous in digital sequential circuit designs. For example, as shown in FIG. 1, a typical latch 100 may include, inter alia, a forward inverter 101, a feedback inverter 102, an input terminal 103 and an output terminal 104. The output voltage level, $V_{OUT}$, remains at a particular voltage level, i.e., either high or low, until an input signal, $V_{IN}$, is received at the input terminal 103, at which time the state of the output may change depending on the nature of the input signal. For example, the state of the output 104 may change from a high state to a low state upon receipt of a logical high signal at the input 103.

In order for the latch to operate properly, i.e., to change state upon receiving a particular input, the input signal levels to the latch must exceed certain thresholds with a sufficient margin. To this end, during a circuit design, it must be ensured that the input signal levels delivered through various signal paths to each of latches in the circuit under design meet the above input signal margin.

One of the ways to ensure satisfaction of the above input signal level requirement is to determine what is often referred to as the "DC margin" for each of the latches present in the circuit being designed. The DC margin is a pair of values, the one margin and the zero margin. The one margin is the difference between the trip voltage ($V_{trip}$) of the forward inverter 101 of the latch 100 and the worst case pull-up input signal level that may be presented to the latch. The zero margin is the difference between the $V_{trip}$ of the forward inverter 101 and the worst case pull-down input signal level that may be presented to the latch 100. The trip voltage $V_{trip}$ is defined as the equilibrium voltage level of the output voltage level and the input voltage level of the forward inverter. In order for a particular circuit design to be deemed acceptable, the DC margin must exceed a minimum margin according to a design guideline.

Unfortunately, heretofore, in order to determine the DC margin of a latch, every possible signal paths from each of the possible circuit elements that may drive the latch must be examined, requiring performance of simulations, using a simulation program, e.g., the SPICE™, for each of the possible signal paths. The prior attempts to determine the DC margin requires numerous simulations, each of which takes a long time to perform, and are thus inefficient and time consuming. This problem may be exacerbated if there are numerous latches in the particular circuit under design.

Thus, there is a need for more efficient method of determining DC margin of a latch, which does not require numerous simulations for every possible signal paths to the latch.

SUMMARY OF INVENTION

In accordance with the principles of the present invention, a method of determining a DC margin of a latch comprises performing a first simulation using a first simulation circuit to determine a trip voltage of a forward inverter of the latch, performing a second simulation using a second simulation circuit to determine a one margin of the latch, the second simulation circuit comprising a worst case pull-up signal path, and performing a third simulation using a third simulation circuit to determine a zero margin of the latch, the third simulation circuit comprising a worst case pull-down signal path.

In accordance with another aspect of the principles of the present invention, a computer program stored on a computer readable storage medium implements a method of determining a DC margin of a latch, and comprises a set of instructions for performing a first simulation using a first simulation circuit to determine a trip voltage of a forward inverter of the latch, performing a second simulation using a second simulation circuit to determine a one margin of the latch, the second simulation circuit comprising a worst case pull-up signal path, and performing a third simulation using a third simulation circuit to determine a zero margin of the latch, the third simulation circuit comprising a worst case pull-down signal path.

In yet another aspect of the principles of the present invention, a simulation circuit for determining a DC margin of a latch comprises a latch portion representing the latch being simulated, the latch portion comprising a forward inverter and a feedback inverter, an input of the forward inverter being operably connected to an input of the latch portion, and an input of the feedback inverter being operably connected to an output of the latch portion, a driver portion representing a driver circuit element capable of supplying an input signal to the latch being simulated, and a pass path subcircuit configured to receive a drive signal from the driver portion, and configured to supply the drive signal to the input of the latch portion, the pass path subcircuit representing one or more pass circuit elements along a worst case signal path between the driver circuit element and the latch being simulated.

DESCRIPTION OF DRAWINGS

Features and advantages of the present invention will become apparent to those skilled in the art from the following description with reference to the drawings, in which.

DETAILED DESCRIPTION OF PREFERRED EMBODIMENTS

For simplicity and illustrative purposes, the principles of the present invention are described by referring mainly to an exemplar embodiment, particularly, with a specific exemplary implementations of various simulation circuits. However, one of ordinary skill in the art would readily recognize that the same principles are equally applicable to, and can be implemented in, other implementations and designs using any other equivalent simulation circuits, and that any such variation would be within such modifications that do not depart from the true spirit and scope of the present invention.

In accordance with the principles of the present invention, a DC margin of a latch of a circuit under design is determined by performing three simulations. A simulation is performed to find the trip voltage of the forwarding inverter of the latch. A second simulation is performed to find the one margin of the latch. Lastly, a third simulation is performed to find the zero margin of the latch.

During each of the simulations to find the on margin and the zero margin, the worst case input signal path from the various driver circuit elements and signal paths within the circuit under design is determined analytically by accumulating weighted resistance of each of the circuit elements along the signal paths. The weights assigned to the circuit elements are empirically determined based on the topology configuration of each of the circuit elements, e.g., the type circuit element, the signal being passed through the circuit element and whether a threshold voltage drop occurs between the drive circuit element and the pass circuit element.

Figure 1:
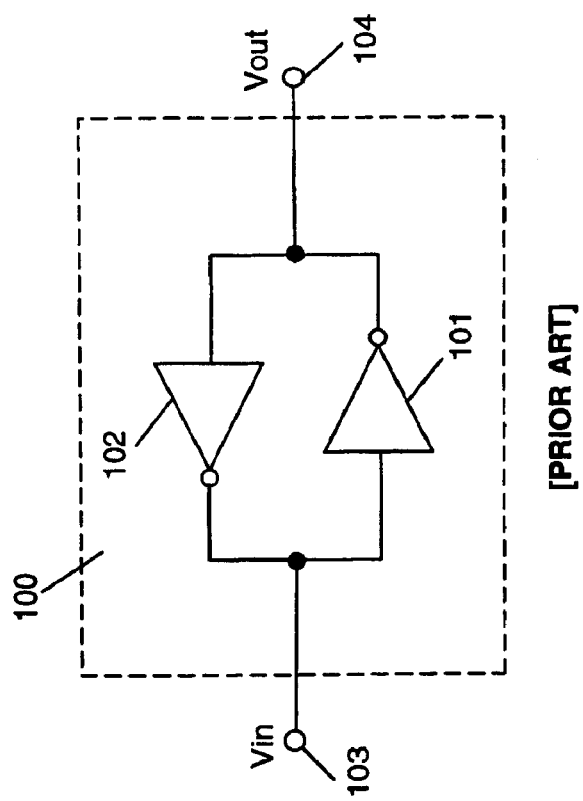
FIG. 1 is a logic diagram of showing the relevant portions of a conventional latch.
Figure 2:
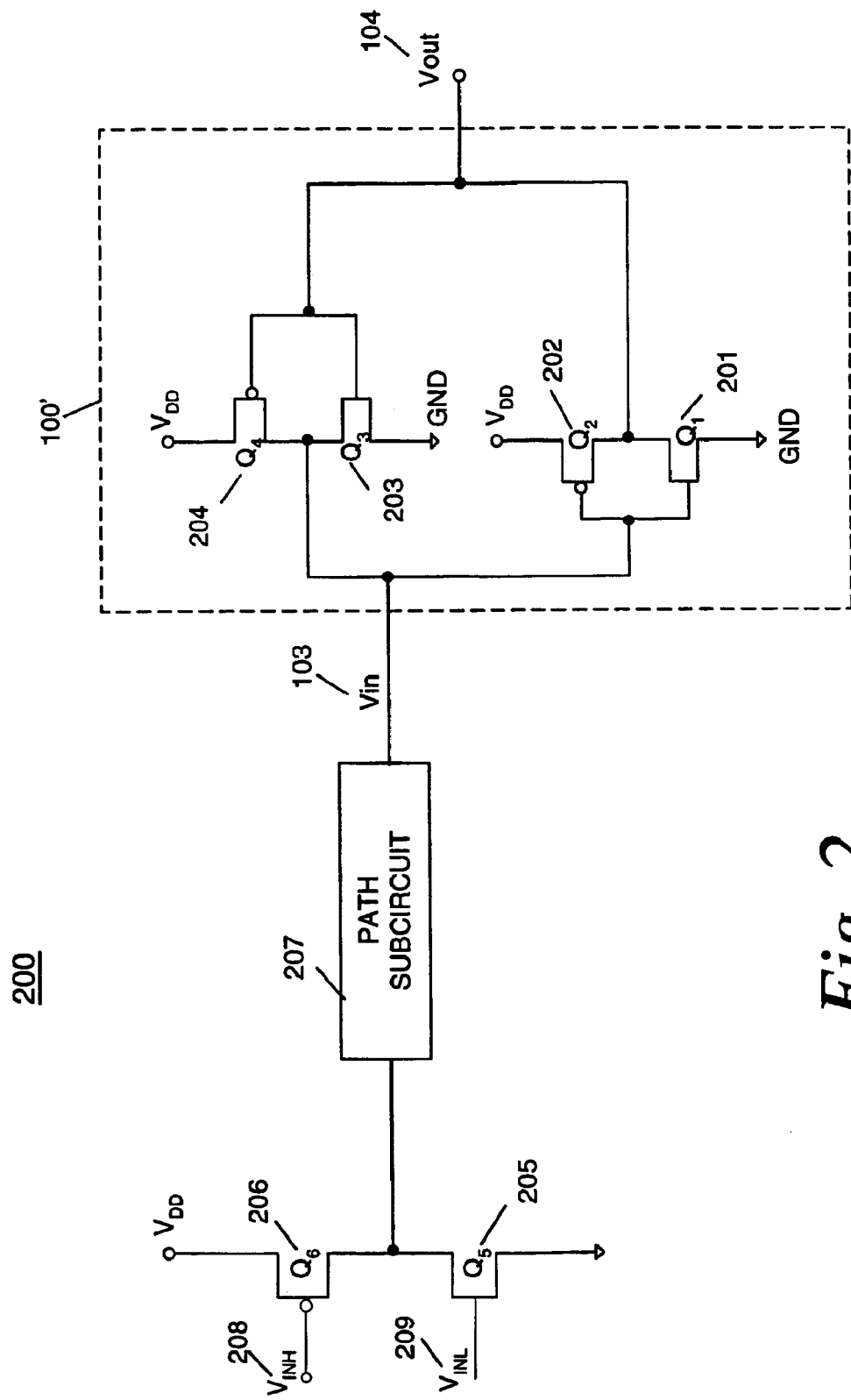
FIG. 2 is a circuit diagram illustrative of an embodiment of a simulation model circuit of the a latch and the corresponding input signal path to the latch in accordance with the principles of the present invention.

In particular, FIG. 2 shows a simulation model circuit 200 representing a latch and its input signal path in accordance with an embodiment of the present invention. The simulation model circuit represents an equivalent circuit model of the actual circuit being simulated, and may not include every circuit elements present in the actual circuit being simulated. For example, the NFET Q1 201 may represent more than one circuit element, e.g., a series of NFETs, of the actual circuit being simulated. It should be understood by those familiar with circuit evaluation techniques that each of circuit elements shown in the model circuit 200 shown in FIG. 2 may be an equivalent circuit of, and represent, a number of circuit elements of the actual circuit under simulation.

The simulation model circuit comprises a latch model 100', which includes two complementary field effect transistor (FET) pairs, each representing the forward inverter and the feedback inverter of the latch. The complementary pair Q1 201 and Q2 202 together represent the forward inverter while the complementary pair Q3 203 and Q4 204 represent the feedback inverter.

The model circuit 200 further comprises a path subcircuit 207 which represent the various circuit elements along a signal path between the input 103 of the latch and a circuit element that may drive the input of the latch. The circuit element that drives the input of the latch is represented by the FETs Q5 205 and Q6 206, each providing a pull-down input signal and a pull-up input signal, respectively, to the input of the latch (i.e., Vin 103) through the path subcircuit 207. As shown, when a logical low signal $V_{INH}$ 208 is supplied to the gate of the PFET Q6 206, the PFET Q6 206 is turned on, and thus Vin 103 is driven high. When a logical high signal $V_{INL}$ 208 is supplied to the gate of the NFET Q5 205, the PFET Q5 205 is turned on, and thus Vin 103 is driven low.

Figure 2A:
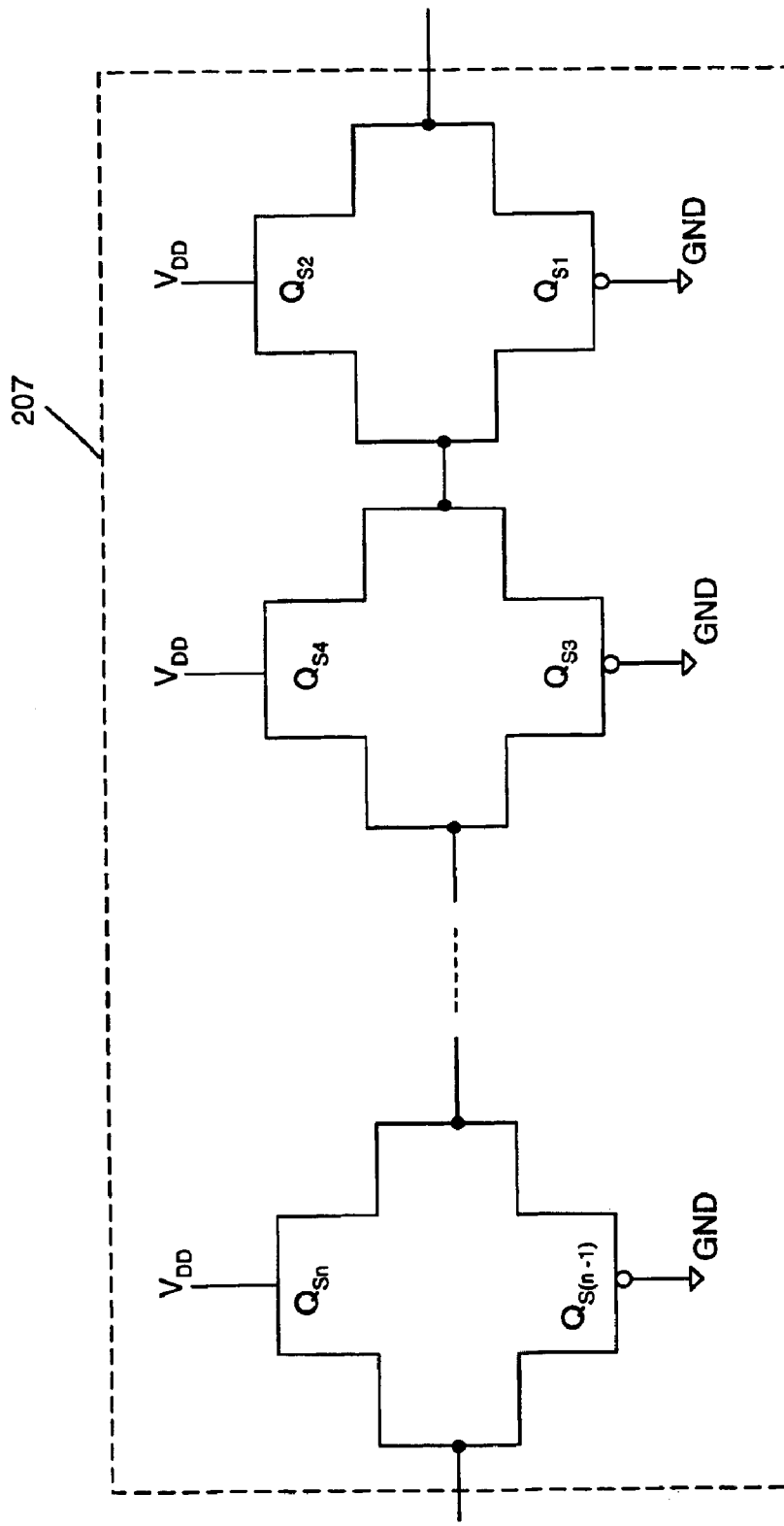
FIG. 2A is a circuit diagram illustrative of an embodiment of the path subcircuit shown in FIG. 2.
Figure 3:
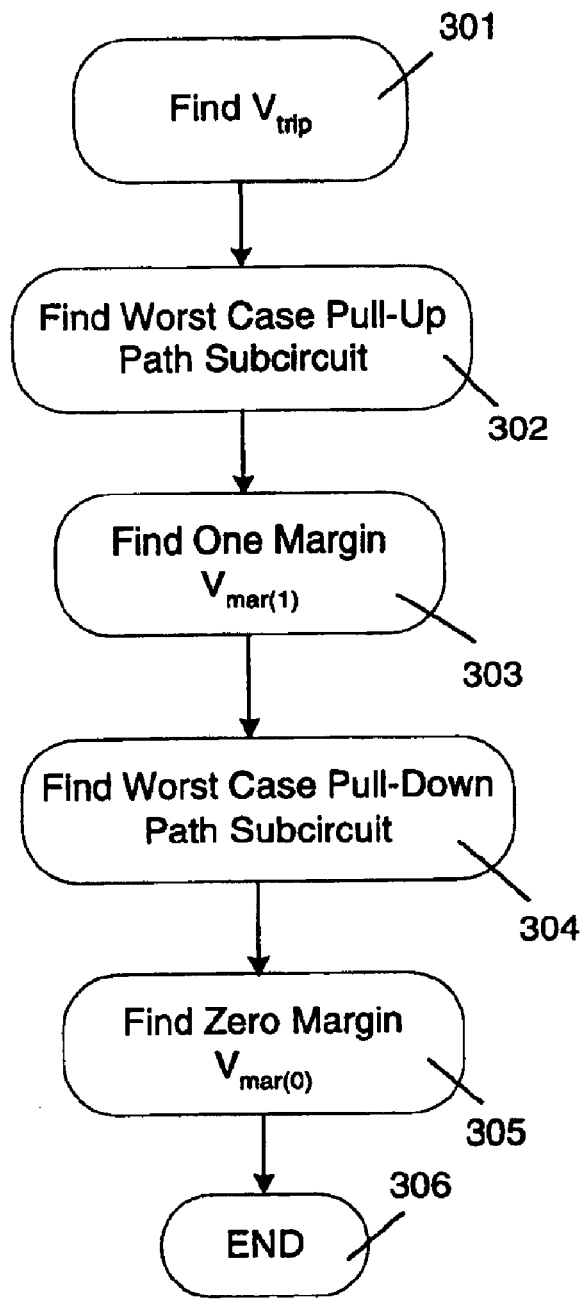
FIG. 3 is flow diagram illustrative of an exemplary embodiment of the process of determining the DC margin of a latch in accordance with an embodiment of the principles of the present invention.

FIG. 2A shows the path subcircuit 207 in more detail. According to an embodiment of the present invention, the path subcircuit 207 comprises n/2 complementary pairs of FETs, $Q_{S1}$ to $Q_{Sn}$, each of which can be configured to have variable size, and can be individually removed from the path subcircuit 207, to simulate the worst case pull-up and pull-down signal paths. In a preferred embodiment of the present invention, the path subcircuit 207 comprises six (6) complementary pairs of FETs.

In an embodiment of the present invention, the worst case pull-up and pull-down signal paths are determined analytically by traversing through each of possible signal paths from the input of the latch to each of circuit elements that can drive the input of the latch, and identifying pass circuit elements along each of the signal paths, through which a signal may pass. For each of identified pass circuit elements, a weight is applied to its resistance, e.g., based on its length and width (L/W). The weights applied to the resistance of the pass circuit elements are empirically determined based on the topology configuration of each of the circuit elements, e.g., the pass circuit element type (e.g., whether the pass circuit element is a single NFET, single PFET or a complementary pair of FETs), the signal being passed through the pass circuit element and whether a threshold voltage drop occurs between the drive circuit element and the pass circuit element.

The weighted resistance of the identified pass circuit elements along a particular signal path are added together to determine the total resistance of the particular signal path, and is compared to the total resistance similarly calculated for other signal paths to determine the worst case signal path which results in the worst degradation of signal level while passing through the signal path.

In a preferred embodiment of the present invention, the path subcircuit 207 is configured to include one or more of the FETs, $Q_{S1}$, and $Q_{Sn}$, each included FET representing identified pass circuit elements. The sizes of the included FETs in the path subcircuit 207 are based on the sizes of the respective pass circuit elements. In an alternative embodiment, the path subcircuit 207 may simply be a resistor element having the weighted total resistance of the worst case signal path identified.

Figure 4:
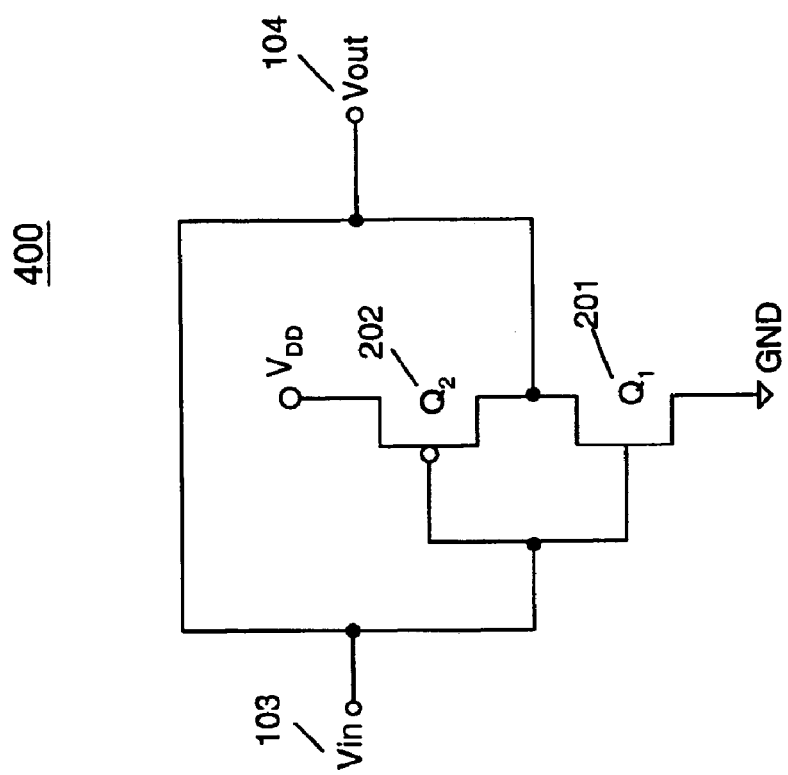
FIG. 4 is a circuit diagram illustrative of an embodiment of a simulation circuit for determining the trip voltage of a forward inverter of a latch in accordance with the principles of the present invention.

The inventive process of determining DC margin of a latch will now be described with references to FIGS. 4 through 6. In step 301, a simulation, e.g., using SPICE™ which is known to those familiar with circuit design testing, is performed to determine the trip point voltage ($V_{trip}$) of the forward inverter of the latch. An exemplary embodiment of the simulation circuit 400 for the $V_{trip}$ determination is shown in FIG. 4. In this example, the simulation circuit 400 includes the forward inverter portion of the latch, and comprises the complementary pair of FETs, Q1 201 and Q2 202.

As shown, in the simulation circuit 400, the input terminal Vin 103 and the output terminal Vout 104 of the forward inverter are connected together. The simulation comprises a DC analysis of the simulation circuit 400 to determine the settling voltage level at the input terminal Vin 103, which is the same as the voltage level at the output terminal Vout 104. Once the voltage levels at the input terminal and the output terminal settles to equal each other, th settling voltage is the trip point voltage ($V_{trip}$) of the forward inverter of the latch.

In step 302, the worst case pull-up signal path and the path subcircuit 207 based on the worst case pull-up signal path are found as previously described. In particular, in an embodiment of the present invention, the worst case pull-up signal path is determined analytically by traversing through each of possible signal paths from the input of the latch to each of pull-up driver circuit elements that can drive a pull-up signal to the input of the latch, and identifying pass circuit elements along each of the signal paths, through which a signal may pass. For each of identified pass circuit elements, a weight is applied to its resistance, e.g., based on its length and width (L/W). The weights applied to the resistance of the pass circuit elements are empirically determined based on the topology configuration of each of the circuit elements, e.g., the pass circuit element type (e.g., whether the pass circuit element is a single NFET, single PFET or a complementary pair of FETs), the signal being passed through the pass circuit element and whether a threshold voltage drop occurs between the pull-up driver circuit element and the pass circuit element.

The weighted resistance of the identified pass circuit elements along a particular signal path are added together to determine a cumulative resistance of the particular signal path, i.e., from the supply voltage $V_{DD}$ through the pull-up driver circuit element and the pass circuit elements to the latch input. The cumulative resistence of each signal path is compared to the total resistance similarly calculated for other signal paths to determine the worst case pull-up signal path, i.e., the signal path with the highest cumulative resistance, which results in the worst degradation of signal level while passing through the signal path.

Figure 5:
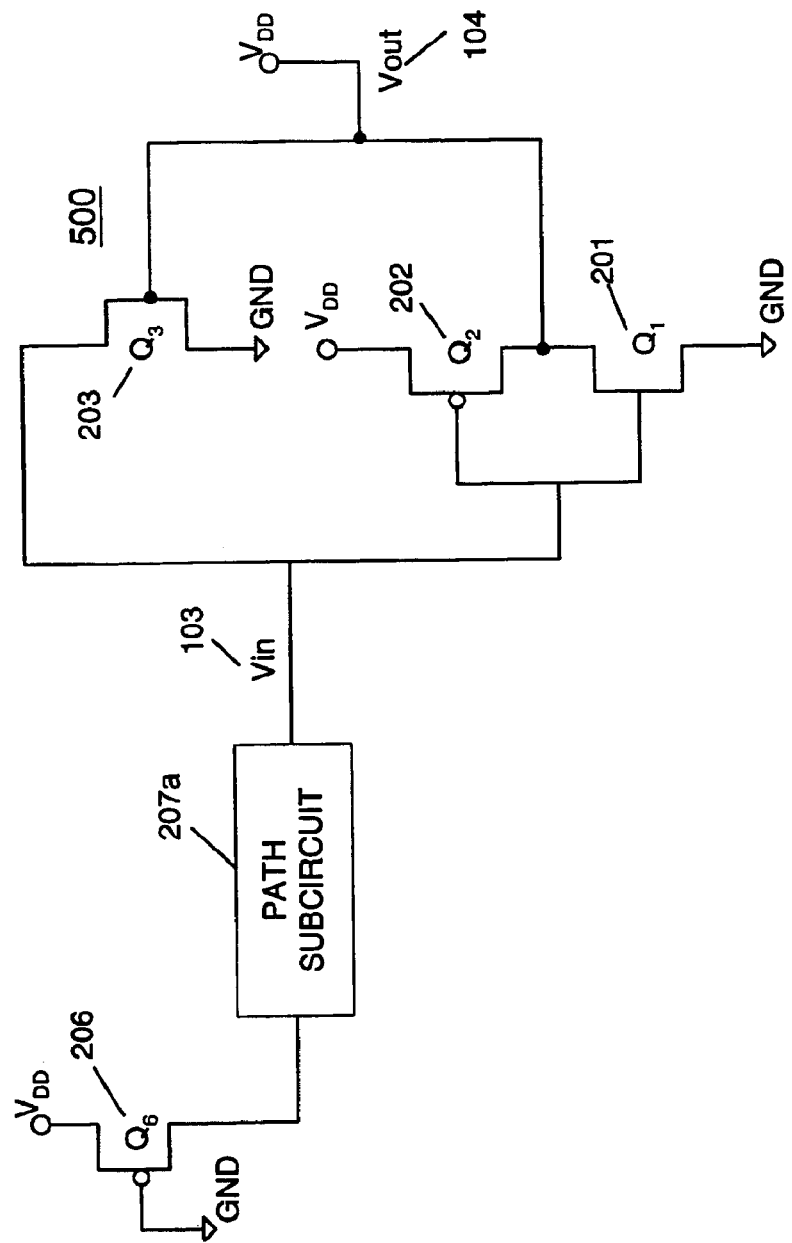
FIG. 5 is a circuit diagram illustrative of an embodiment of a simulation circuit for determining the one margin of a latch in accordance with the principles of the present invention.
Figure 6:
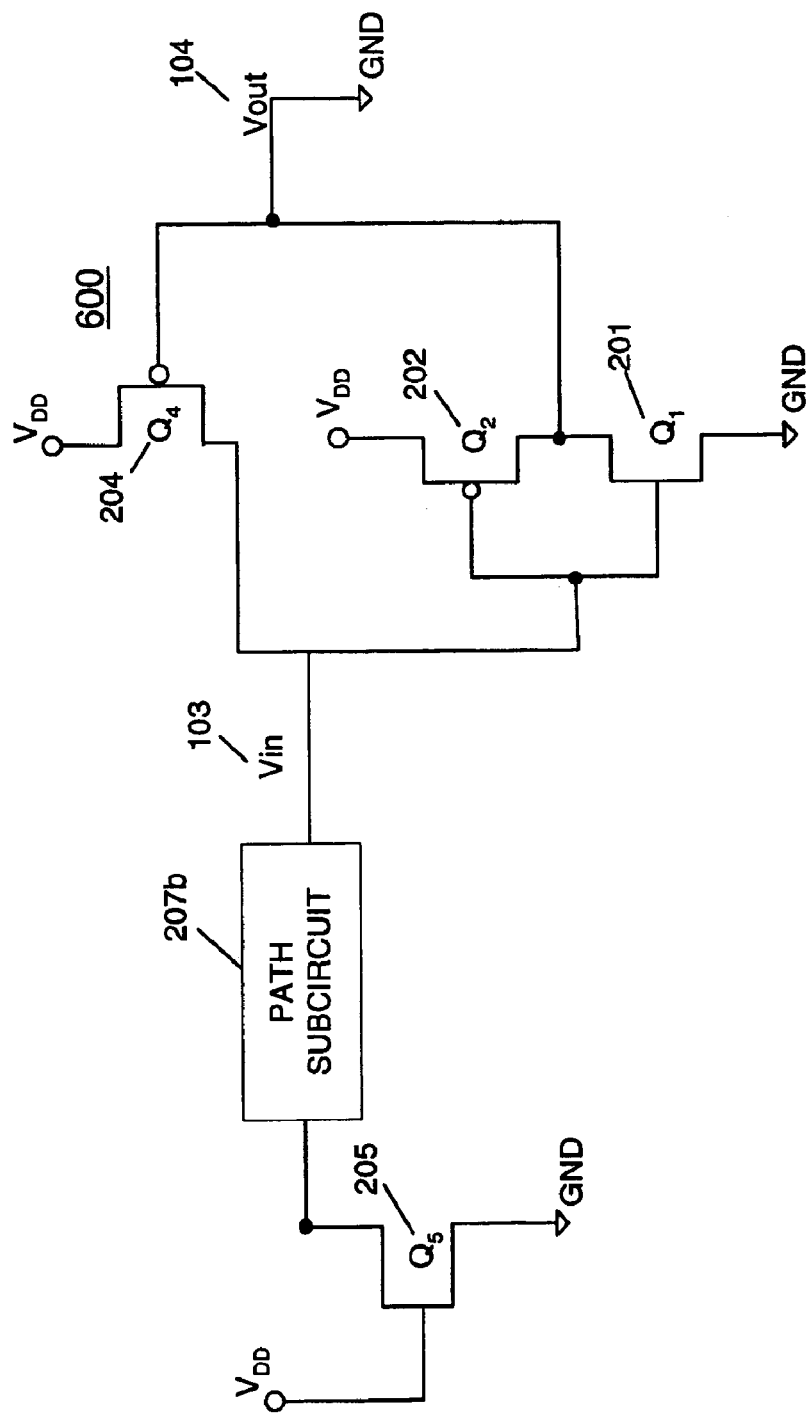
FIG. 6 is a circuit diagram illustrative of an embodiment of a simulation circuit for determining the zero margin of a latch in accordance with the principles of the present invention.

The pull-up driver of the identified worst case pull-up signal path is mapped to an equivalent canonical driver circuit Q6 206 as shown in FIG. 5. The path subcircuit 207a is constructed to include one or more of the FETs, $Q_{S1}$, and $Q_{Sn}$, (as shown in FIG. 2A), each included FET representing identified pass circuit elements of the worst case pull-up signal path. The sizes of the FETs included in the path subcircuit 207 are based on the sizes of the respective pass circuit elements.

In step 303, a simulation is performed to determine the one margin ($Vmar_{(1)}$). An exemplary embodiment of the simulation circuit 500 for the $Vmar_{(1)}$ determination is shown in FIG. 5. The $Vmar_{(1)}$ simulation circuit 500 includes the forward inverter portion, i.e., the complementary pair of FETs Q1 and Q2, the NFET Q3, the PFET Q6 and the path subcircuit 207a constructed in step 302 above. In this exemplary simulation circuit 500, the FETs Q4 204 and Q5 205 shown in FIG. 2 are omitted. However, in an alternative embodiment, the FETs Q4 204 and Q5 205 may be included, and turned off.

The $Vmar_{(1)}$ simulation comprises a DC analysis of the simulation circuit 500 with the output Vout 104 initially set to logical high, i.e., set to $V_{DD}$, and determining the voltage level at the input terminal Vin 103. If the voltage level at the input terminal Vin 103 exceeds the $V_{trip}$, and is sufficiently high to overcome the NFET Q3 203, the state of the output, Vout 104, would switch from the high initial setting to a logical low. The one margin, $Vmar_{(1)}$, is the difference of the voltage level at Vin 103 and $V_{trip}$, i.e., $Vmar_{(1)}=Vin-V_{trip}$.

In step 304, the worst case pull-down signal path and the path subcircuit 207 based on the worst case pull-down signal path are found as previously described. In particular, in an embodiment of the present invention, the worst case pull-down signal path is determined analytically by traversing through each of possible signal paths from the input of the latch to each of pull-down driver circuit elements that can drive a pull-down signal to the input of the latch, and identifying pass circuit elements along each of the signal paths, through which the pull-down signals may pass. For each of identified pass circuit elements, a weight is applied to its resistance, e.g., based on its length and width (L/W). The weights applied to the resistance of the pass circuit elements are empirically determined based on the topology configuration of each of the circuit elements, e.g., the pass circuit element type (e.g., whether the pass circuit element is a single NFET, single PFET or a complementary pair of FETs), the signal being passed through the pass circuit element and whether a threshold voltage drop occurs between the pull-down driver circuit element and the pass circuit element.

The weighted resistance of the identified pass circuit elements along a particular signal path are added together to determine a cumulative resistance of the particular signal path, i.e., from the ground (GND) through the pull-down driver circuit element and the pass circuit elements to the latch input. The cumulative resistence of each signal path is compared to the total resistance similarly calculated for other pull-down signal paths to determine the worst case pull-down signal path, i.e., the signal path with the highest cumulative resistance.

The pull-down driver of the identified worst case pull-down signal path is mapped to an equivalent canonical driver circuit Q5 206 as shown in FIG. 5. The path subcircuit 207b is constructed to include one or more of the FETs, $Q_{S1}$ and $Q_{Sn}$ (as shown in FIG. 2A), each included FET representing identified pass circuit elements of the worst case pull-down signal path. The sizes of the FETs included in the path subcircuit 207 are based on the sizes of the respective pass circuit elements.

In step 305, a simulation is performed to determine the zero margin ($Vmar_{(0)}$). An exemplary embodiment of the simulation circuit 600 for the $Vmar_{(0)}$ determination is shown in FIG. 6. The $Vmar_{(0)}$ simulation circuit 600 includes the forward inverter portion, i.e., the complementary pair of FETs Q1 and Q2, the NFET Q5, the PFET Q4 and the path subcircuit 207b constructed in step 304 above. In this exemplary simulation circuit 600, the FETs Q3 203 and Q6 206 shown in FIG. 2 are omitted. However, in an alternative embodiment, the FETs Q3 203 and Q6 206 may be included, and turned off.

The $Vmar_{(0)}$ simulation comprises a DC analysis of the simulation circuit 600 with the output Vout 104 initially set to logical low, i.e., set to ground, and determining the voltage level at the input terminal Vin 103. If the voltage level at the input terminal Vin 103 is below the $V_{trip}$, and is sufficiently low to overcome the PFET Q4 204, the state of the output, Vout 104, would switch from the low initial setting to a logical high. The zero margin, $Vmar_{(0)}$, is the difference of $V_{trip}$ and the voltage level at Vin 103, i.e., $Vmar_{(0)}=V_{trip}-Vin$. Finally, the process ends in step 306.

If each of the one margin and the zero margin exceed a design guideline margin thresholds, the circuit design is deemed acceptable, and proper operations of the latch is ensured.

As can be appreciated, the DC margin determination method described herein allows an efficient and fast determination of DC margin of a latch without requiring numerous time consuming simulations for each of the possible signal paths to the input of the latch.

Specific program listings for an embodiment of a method of determining the DC margin of a latch in accordance with the principles of the present invention is provided in the Appendix, which appears below.

While the invention has been described with reference to the exemplary embodiments thereof, those skilled in the art will be able to make various modifications to the described embodiments of the invention without departing from the true spirit and scope of the invention. The terms and descriptions used herein are set forth by way of illustration only and are not meant as limitations. In particular, although the method of the present invention has been described by examples, the steps of the method may be performed in a different order than illustrated or simultaneously. Those skilled in the art will recognize that these and other variations are possible within the spirit and scope of the invention as defined in the following claims and their equivalents.

APPENDIX

```
/* There are 8 FETs in the model and I want to array to index from 1 to 8 */
#define NUM_CKLATCH_FETS 7
#define NUM_PASSCKT_FETS 7
#define ALL_SPICE_FET_PARAMETERS \
fprintf(MYDECK,"(m1_w m1_l m2_w m2_l m3_w m3_l m4_w m4_l m5_w m5_l m6_w m6_l)\n" );
void declare_vth_ckt(MYDECK, lmodel)
FILE* MYDECK ;
int lmodel[NUM_CKLATCH_FETS] ;
{
        fprintf(MYDECK,".subckt vth_ckt 100 %%\"GND\"");
        ALL_SPICE_FET_PARAMETERS;
        fprintf(MYDECK,"M1 3 3 0 0 N%s L=m1_l*1e-6 W=m1_w*1e-6 AD=1.5 AS=1.5 PD=1.5 PS=1.5\n", lmodel[1]? "L" : "");
        fprintf(MYDECK,"M2 3 3 100 0 P%s L=m2_l*1e-6 W=m2_w*1e-6 AD=1.5 AS=1.5 PD=1.5 PS=1.5\n", lmodel[2]? "L" : "");
        fprintf(MYDECK,".ends vth_ckt\n");
}
#define NOPASSFET_R 1.0e-3
void declare_passfet_ckt(MYDECK, ckt_name, ppass_fets, npass_fets)
FILE* MYDECK ; char* ckt_name ; elem_pr npass_fets[NUM_PASSCKT_FETS],
ppass_fets[NUM_PASSCKT_FETS] ;
{
    int i, left, right, left_portnum, levels = 0;
    /* determine the number of passfet levels. */
    for (i = 1; i < NUM_PASSCKT_FETS; i++) { if((npass_fets[i] != NULL) || (ppass_fets[i] != NULL)) levels++ ; }
    if (levels == 0) left_portnum = 3;
    else left_portnum = levels + 2 ;
        fprintf(MYDECK,".subckt %s 100 2 %d %%\"GND\"\n", ckt_name, left_portnum) ;
        if (levels == 0)
/* No pass fets, so use a tiny Resistor. */
            fprintf(MYDECK,"R5 3 2 %.2e\n", NOPASSFET_R);
        else
            for (i = 1; i < NUM_PASSCKT_FETS; i++) {
left = i + 2; right = i + 1 ;
            if (npass_fets[i])
    fprintf(MYDECK, "M%d %d 100 %d 0 N%s L=%.2f* 1e-6 W=%.2f* 1e-6 AD=1.5 AS=1.5 PD=1.5 PS=1.5\n",
        2*i -1, left, right, npass_fets[i]—>len > CheckLatchLongNLength_ReqERC ? "L" : "",
        npass_fets[i]—>len, npass_fets[i]—>wid);
            if (ppass_fets[i])
    fprintf(MYDECK,"M%d %d 0 %d 0 P%s L=%.2f* 1e-6 W=%.2f* 1e-6 AD=1.5 AS=1.5 PD=1.5 PS=1.5\n",
        2*i, left, right, ppass_fets[i]—>len > CheckLatchLongPLength_ReqERC ? "L" : "",
        ppass_fets[i]—>len, ppass_fets[i]—>wid);
                }
        fprintf(MYDECK,".ends %s\n", ckt_name);
}
void declare_set0_ckt(MYDECK, lmodel)
FILE* MYDECK ; int lmodel[NUM_CKLATCH_FETS] ;
{
        fprintf(MYDECK,".subckt set0_ckt 100 %%\"GND\"") ;
        ALL_SPICE_FET_PARAMETERS
        fprintf(MYDECK,"M1 4 3 0 0 N%s L=m1_l*1e-6 W=m1_w*1e-6 AD=1.5 AS=1.5 PD=1.5 PS=1.5\n",
        lmodel[1] ? "L" : "");
        fprintf(MYDECK,"M2 4 3 100 0 P%s L=m2_l*1e-6 W=m2_w*1e-6 AD=1.5 AS=1.5 PD=1.5 PS=1.5\n",
        lmodel[2] ? "L" : "");
        fprintf(MYDECK,"M4 3 0 100 0 P%s L=M4_l*1e-6 W=m4_w*1e-6 AD=1.5 AS=1.5 PD=1.5 PS=1.5\n",
        lmodel[4] ? "L" : "");
        fprintf(MYDECK,"X0 100 2 3 %%\"GND\" pulldown_passfet_ckt \n") ;
        fprintf(MYDECK,"M5 2 100 0 0 N%s L=m5_l*1e-6 W=m5_w*1e-6 AD=1.5 AS=1.5 PD=1.5 PS=1.5\n",
        lmodel[5] ? "L" : "");
        fprintf(MYDECK,".ends set0_ckt\n");
}
void declare_set1_ckt(MYDECK, lmodel)
FILE* MYDECK ; int lmodel[NUM_CKLATCH_FETS] ;
{
        fprintf(MYDECK,".subckt set1_ckt 100 %%\"GND\"") ;
        ALL_SPICE_FET_PARAMETERS
```

APPENDIX-continued

```
        fprintf(MYDECK,"M1 4 3 0 0 N%s L=m1_l*1e-6 W=m1_w*1e-6 AD=1.5 AS=1.5 PD=1.5 PS=1.5\n",
        lmodel[1] ? "L" : "");
        fprintf(MYDECK,"M2 4 3 100 0 P%s L=m2_l*1e-6 W=m2_w*1e-6 AD=1.5 AS=1.5 PD=1.5 PS=1.5\n",
        lmodel[2] ? "L" : "");
        fprintf(MYDECK,"M3 3 100 0 0 N%s L=m3_l*1e-6 W=m3_w*1e-6 AD=1.5 AS=1.5 PD=1.5 PS=1.5\n",
        lmodel[3] ? "L" : "");
        fprintf(MYDECK,"X0 100 2 3 %%\"GND\" pullup_passfet_ckt \n") ;
        fprintf(MYDECK,"M6 2 0 100 0 P%s L=m6_l*1e-6 W=m6_w*1e-6 AD=1.5 AS=1.5 PD=1.5 PS=1.5\n",
        lmodel[6] ? "L" : "");
        fprintf(MYDECK,".ends set1_ckt\n");
}
void add_vth_ckt_to_deck(MYDECK, m_w, m_l)
FILE *MYDECK; double m_w[NUM_CKLATCH_FETS] ; double m_l[NUM_CKLATCH_FETS] ;
{
        fprintf(MYDECK,"X0 100 %%\"GND\" vth_ckt (");
        fprintf(MYDECK,"%.2f%.2f",m_w[1], m_l[1]) ;
        fprintf(MYDECK,"%.2f%.2f",m_w[2], m_l[2]) ;
        fprintf(MYDECK,"%.2f%.2f",m_w[3], m_l[3]) ;
        fprintf(MYDECK,"%.2f%.2f",m_w[4], m_l[4]) ;
        fprintf(MYDECK,"%.2f%.2f",m_w[5], m_l[5]) ;
        fprintf(MYDECK,"%.2f%.2f",m_w[6], m_l[6]) ;
        fprintf(MYDECK,")\n") ;
}
void add_set0_ckt_to_deck(MYDECK, m_w, m_l)
FILE *MYDECK; double m_w[NUM_CKLATCH_FETS] ; double m_l[NUM_CKLATCH_FETS] ;
{
        fprintf(MYDECK,"X1 100 %%\"GND\" set0_ckt (");
        fprintf(MYDECK,"%.2f%.2f",m_w[1], m_l[1]) ;
        fprintf(MYDECK,"%.2f%.2f",m_w[2], m_l[2]) ;
        fprintf(MYDECK,"%.2f%.2f",m_w[3], m_l[3]) ;
        fprintf(MYDECK,"%.2f%.2f",m_w[4], m_l[4]) ;
        fprintf(MYDECK,"%.2f%.2f",m_w[5], m_l[5]) ;
        fprintf(MYDECK,"%.2f%.2f",m_w[6], m_l[6]) ;
        fprintf(MYDECK,")\n") ;
}
void add_set1_ckt_to_deck(MYDECK, m_w, m_l)
FILE *MYDECK; double m_w[NUM_CKLATCH_FETS] ; double m_l[NUM_CKLATCH_FETS] ;
{
        fprintf(MYDECK,"X2 100 %%\"GND\" set1_ckt(");
        fprintf(MYDECK,"%.2f%.2f",m_w[1], m_l[1]) ;
        fprintf(MYDECK,"%.2f%.2f",m_w[2], m_l[2]) ;
        fprintf(MYDECK,"%.2f%.2f",m_w[3], m_l[3]) ;
        fprintf(MYDECK,"%.2f%.2f",m_w[4], m_l[4]) ;
        fprintf(MYDECK,"%.2f%.2f",m_w[5], m_l[5]) ;
        fprintf(MYDECK,"%.2f%.2f",m_w[6], m_l[6]) ;
        fprintf(MYDECK,")\n") ;
}
/* Return TRUE if this latch has tristate feedback. */
int latch_has_tristate_feedback(node) node_pr node ;
{
    node_pr output, inv_output, tsinv_node ;
    elem_pr elem ;
    if (!NIsLatch(node)) return FALSE ;
    tsinv_node = NTriStateInvOf(node) ;
    for_gate_elems(elem, node) {
        output = get_output(elem) ;
        if (!output) continue ;
        inv_output = NStatInvOf(output) ;
        if (NSame(inv_output, node) && NSame(output, tsinv_node)) { return TRUE ; }
    } end_gate_elems
    return FALSE ;
}
/* Given a latch node return the tristate feedback node. */
node_pr get_tristate_feedback(node)
node_pr node ;
{
    elem_pr elem ;
    node_pr output, inv_output, tsinv_node ;
    if (!NIsLatch(node)) return NULL ;
    tsinv_node = NTriStateInvOf(node) ;
    for_gate_elems(elem, node) {
        output = get_output(elem) ;
        if (!output) continue ;
        inv_output = NStatInvOf(output) ;
        if (NSame(inv_output, node) && NSame(output, tsinv_node)) { return output ; }
    } end_gate_elems
    return NULL ;
}
```

APPENDIX-continued

```c
/* Find the FET widths and lengths for this node. Return a non zero if there is a problem running. */
#define ABSENT_FEEDBACK_FET_L_MULT 20.0
int find_checklatch_latchfets(node, m_w, m_l)
node_pr node ; double *m_w, *m_l ;
{
    elem_pr elem, nelem;
    node_pr output, inv_output, inv_node, tsinv_node, gate, inv_gate, ngate, inv_ngate, ts_feedback, other_side;
    int has_tsfeedback, has_single_feedback, has_inv_feedback ;
    inv_node = NStatInvOf(node) ;
    tsinv_node = NTriStateInvOf(node) ;
    has_tsfeedback = latch_has_tristate_feedback(node) ;
    has_single_feedback = (!inv_node && !tsinv_node) ? TRUE : FALSE ;
    has_inv_feedback = (!has_tsfeedback && !has_single_feedback) ? TRUE : FALSE ;
    /* Find the forward inverter FETs. */
    if (has_single_feedback) {
        for_gate_elems(elem, node) {
            output = get_output(elem) ;
            if (!output) continue ;
            inv_output = NStatInvOf(output) ;
            if (NSame(inv_output, node)) {
                if (ETypeIsP(elem)) { m_w[2] = elem—>wid ; m_l[2] = elem—>len ; }
                if (ETypeIsN(elem)) { m_w[1] = elem—>wid ; m_l[1] = elem—>len ; }
            }
        } end_gate_elems
    }
    if (has_inv_feedback || has_tsfeedback) {
        for_gate_elems(elem, node) {
            output = get_output(elem) ;
            if (!output) continue ;
            inv_output = NStatInvOf(output) ;
            if ( (NSame(inv_output, node) && NSame(output, inv_node)) ||
                    (NSame(inv_output, node) && NSame(output, tsinv_node)) ) {
                if (ETypeIsP(elem)) { m_w[2] = elem—>wid ; m_l[2] = elem—>len ; }
                if (ETypeIsN(elem)) { m_w[1] = elem—>wid ; m_l[1] = elem—>len ; }
            }
        } end_gate_elems
    }
if (m_w[1] == 0 || m_w[2] == 0) return 1 ;
/* Find the feedback inverter FETs. */
if (has_single_feedback) {
    for_chan_fets(elem, node) {
        gate = EGate(elem) ;
        inv_gate = NStatInvOf(gate) ;
        if (NSame(node, inv_gate)) {
            if (ETypeIsP(elem)) { m_w[4] = elem—>wid ; m_l[4] = elem—>len ; }
            if (ETypeIsN(elem)) { m_w[3] = elem—>wid ; m_l[3] = elem—>len ; }
        }
    } end_chan_fets
}
if (has_tsfeedback) {
    ts_feedback = get_tristate_feedback(node) ;
    for_chan_fets(elem, node) {
        gate = EGate(elem) ;
        inv_gate = NStatInvOf(gate) ;
        if (NSame(node, inv_gate) && NSame(ts_feedback, gate) && ETypeIsP(elem)) {
            m_w[4] = elem—>wid ; m_l[4] = elem—>len ;
        }
        if (ETypeIsN(elem)) {
/* Type I tristate inverter. */
if (NSame(node, inv_gate) && NSame(ts_feedback, gate)) { m_w[3] = elem—>wid ; m_l[3] = elem—>len ; }
/* Type II tristate inverter. */
else {
    other_side = EOtherChan(elem, node) ;
    nested_for_chan_elems(nelem, other_side) {
        if (ETypeIsN(nelem)) {
            ngate = EGate(nelem) ;
            inv_ngate = NStatInvOf(ngate) ;
            if (NSame(node, inv_ngate) && NSame(ts_feedback, ngate)) { m_w[3] = nelem—>wid ; m_l[3] = nelem—>len ; }
        }
    } nested_end_chan_elems
}
        }
    } end_chan_fets
}
if (has_inv_feedback) {
    for_chan_fets(elem, node) {
        gate = EGate(elem) ;
        inv_gate = NStatInvOf(gate) ;
        if (NSame(node, inv_gate) && NSame(inv_node, gate)) {
```

APPENDIX-continued

```
                if (ETypeIsP(elem)) { m_w[4] = elem—>wid ; m_l[4] = elem—>len ; }
                if (ETypeIsN(elem)) { m_w[3] = elem—>wid ; m_l[3] = elem—>len ; }
            }
        } end_chan_fets
    }
    /* Some latches have missing Feedback FETs */
    if (m_w[3] == 0 && m_w[4] == 0) return 1 ;
    if (m_w[3] == 0) { m_w[3] = MinGateZ_ReqERC ; m_l[3] = ABSENT_FEEDBACK_FET_L_MULT *
DeviceL_ReqERC ; }
    if (m_w[4] == 0) { m_w[4] = MinGateZ_ReqERC ; m_l[4] = ABSENT_FEEDBACK_FET_L_MULT *
DeviceL_ReqERC ; }
    return 0 ;
}
/* For a given tree, write into the deck the element names. This is a recursive routine. */
void add_fet_tree_comments_to_deck(DECK, dlnode_ptr)
FILE* DECK ; dlnodeptr dlnode_ptr;
{
    char message[MAXSTRING] ;
    elem_pr this_elem, parallel_elem ;
    /* Go across */
    if (dlnode_ptr—>next) { add_fet_tree_comments_to_deck(DECK, dlnode_ptr—>next); }
    /* Go down if FETs exist there */
    if (dlnode_ptr—>down) { add_fet_tree_comments_to_deck(DECK, dlnode_ptr—>down); }
    this_elem = dlnode_ptr—>elem ;
    sprintf(message, "%s gate: %s source: %s drain: %s width: %.4f",
        this_elem—>name, this_elem—>gate—>name, this_elem—>source—>name, this_elem—>drain—>name,
this_elem—>wid) ;
    add_comment_to_deck(DECK, message) ;
    /* A channel parallel element will not show up in the tree, but will be used in effective_w_calc_from_tree */
    parallel_elem = this_elem—>chan_parallel ;
    if (parallel_elem && !ESame(parallel_elem, this_elem)) {
        sprintf(message, "%s gate: %s source: %s drain: %s width: %.4f",
            parallel_elem—>name, parallel_elem—>gate—>name, parallel_elem—>source—>name, parallel_elem—>drain—>name,
parallel_elem—>wid) ;
        add_comment_to_deck(DECK, message) ;
    }
}
/* Annotate the deck with the FETs used to in build_generic_tree. Also record in the deck all the pass fets
included in the pullup and pulldown models. */
void add_checklatch_comments_to_deck(MYDECK, pulldown_ppass_fets, pulldown_npass_fets,
pullup_ppass_fets,
pullup_npass_fets, ndriver_node, pdriver_node)
elem_pr pulldown_npass_fets[NUM_PASSCKT_FETS], pulldown_ppass_fets[NUM_PASSCKT_FETS] ;
elem_pr pullup_npass_fets[NUM_PASSCKT_FETS], pullup_ppass_fets[NUM_PASSCKT_FETS] ;
node_pr pdriver_node, ndriver_node ; FILE* MYDECK ;
{
    elem_pr elem, this_elem;
    dlnodeptr nfet_tree_ptr,pfet_tree_ptr;
    double nfet_max_l_over_w,nfet_min_l_over_w,nfet_in_parallel;
    double pfet_max_l_over_w,pfet_min_l_over_w,pfet_in_parallel;
    int node_type_flag, i;
    char message[MAXSTRING] ;
    add_comment_to_deck(MYDECK, " Pullup path passfets info: ") ;
    if (pullup_npass_fets[1] && pullup_ppass_fets[1])
        add_comment_to_deck(MYDECK, " Latch pullup passfet structure: COMPLIMENTARY ") ;
    else if (pullup_npass_fets[1])
        add_comment_to_deck(MYDECK, " Latch pullup passfet structure: NFET ") ;
    else if (pullup_ppass_fets[1])
        add_comment_to_deck(MYDECK, " Latch pullup passfet structure: PFET ") ;
    else
        add_comment_to_deck(MYDECK, " Latch pullup passfet structure: NONE ") ;
    for (i = 1; i < NUM_PASSCKT_FETS; i++) {
        if (pullup_npass_fets[i]) {
            this_elem = pullup_npass_fets[i] ;
            sprintf(message, "%s gate: %s source: %s drain: %s width: %.4f",
                this_elem—>name, this_elem—>gate—>name, this_elem—>source—>name, this_elem—>drain—>name,
this_elem—>wid) ;
            add_comment_to_deck(MYDECK, message) ;
        }
        if (pullup_ppass_fets[i]) {
            this_elem = pullup_ppass_fets[i] ;
            sprintf(message, "%s gate: %s source: %s drain: %s width: %.4f",
                this_elem—>name, this_elem—>gate—>name, this_elem—>source—>name, this_elem—>drain—>name,
this_elem—>wid) ;
            add_comment_to_deck(MYDECK, message) ;
        }
    }
```

APPENDIX-continued

```
        add_comment_to_deck(MYDECK, " Pulldown path passfets info: ") ;
        if (pulldown_npass_fets[1] && pulldown_ppass_fets[1])
                add_comment_to_deck(MYDECK, " Latch pulldown passfet structure: COMPLIMENTARY ") ;
        else if (pulldown_npass_fets[1])
                add_comment_to_deck(MYDECK, " Latch pulldown passfet structure: NFET ") ;
        else if (pulldown_ppass_fets[1])
                add_comment_to_deck(MYDECK, " Latch pulldown passfet structure: PFET ") ;
        else
                add_comment_to_deck(MYDECK, " Latch pulldown passfet structure: NONE ") ;
        for (i = 1; i < NUM_PASSCKT_FETS; i++) {
                if (pulldown_npass_fets[i]) {
                        this_elem = pulldown_npass_fets[i] ;
                        sprintf(message, "%s gate: %s source: %s drain: %s width: %.4f", this_elem->name, this_elem->gate->name,
this_elem->source->name, this_elem->drain->name, this_elem->wid) ;
                        add_comment_to_deck(MYDECK, message) ;
                }
                if (pulldown_ppass_fets[i]) {
                        this_elem = pulldown_ppass_fets[i] ;
                        sprintf(message, "%s gate: %s source: %s drain: %s width: %.4f", this_elem->name, this_elem->gate->name,
this_elem->source->name, this_elem->drain->name, this_elem->wid) ;
                        add_comment_to_deck(MYDECK, message) ;
                }
        }
        /* Include as comments all the FETs that make up the generic trees. */
        nfet_tree_ptr = build_generic_tree(ndriver_node,NTYPE,0,&node_type_flag);
        pfet_tree_ptr = build_generic_tree(pdriver_node,PTYPE,0,&node_type_flag);
        if (nfet_tree_ptr) {
            add_comment_to_deck(MYDECK, "NFET driver values:") ;
            add_fet_tree_comments_to_deck(MYDECK,nfet_tree_ptr);
            free_fet_tree(nfet_tree_ptr,nfet_tree_ptr);
        }
        else { add_comment_to_deck(MYDECK, "Using Ported NFET driver value") ; }
        if (pfet_tree_ptr) {
            add_comment_to_deck(MYDECK, "PFET driver values:") ;
            add_fet_tree_comments_to_deck(MYDECK,pfet_tree_ptr);
            free_fet_tree(pfet_tree_ptr,pfet_tree_ptr);
        }
        else { add_comment_to_deck(MYDECK, "Using Ported PFET driver value") ; }
}
/* Given two nodes, find one P and one N pass fet between these two nodes if there are any. If there are more
than one pair of N and P, then this routine returns the first two that it finds. */
void find_passfets_between_nodes(node, other_node, n_elem, p_elem)
node_pr node, other_node ; elem_pr * n_elem, *p_elem ;
{
        elem_pr elem ;
        node_pr other_node2 ;
        *n_elem = *p_elem = NULL ;
        for_chan_elems(elem, other_node) {
                if (EIsPassFet(elem)) {
                        other_node2 = EOtherChan(elem,other_node) ;
                        if (NSame(other_node2,node)) {
                                if (ETypeIsN(elem)) *n_elem = elem ;
if (ETypeIsP(elem)) *p_elem = elem ;
                        }
                }
        end_chan_elems }
}
/* Given a latch node, find the node that in turn provide the worst case pullup to VDD or the worst case
pulldown to GND. Assume that this node is a pass fet output. This routine calls itself until it is on a node which
is a passfet input and not a passfet output. It keeps track of the current worst case driver and updates a higher
level record of the worst case driver's characteristics as it goes along. Search only in the direction of signal flow.
*/
void find_checklatch_driver_r(node, wc_node, type, wc_width, wc_loverw, ppass_fets, npass_fets, level,
wc_ppass_fets, wc_npass_fets, wc_levels)
node_pr node ; node_pr* wc_node ; int type, level ; int *wc_levels ;
elem_pr *ppass_fets, *npass_fets ; elem_pr *wc_ppass_fets, *wc_npass_fets ; double *wc_width,
*wc_loverw ;
{
        elem_pr elem ; node_pr other_node ; dlnodeptr fet_tree_ptr,pfet_tree_ptr;
        double fet_max_l_over_w,fet_min_l_over_w,fet_in_parallel;
        int is_npass, is_ppass, i, node_type_flag, nfet_vt_drop, pfet_vt_drop ;
        double node_width, total_loverw, stage_loverw, nscale, pscale ; elem_pr n_elem, p_elem ; double nfet_loverw,
pfet_loverw ;
        for_chan_fets(elem, node) {
                other_node = EOtherChan(elem,node) ;
                if (NIsPassGateIn(other_node) && !NIsMarked(other_node) && NSame(other_node, EInputChan(elem))) {
                        push_node_set_mark(other_node) ;
                        /* The calculation of cumulative l_over_w depends on the type of pass fet. */
                        find_passfets_between_nodes(node, other_node, &n_elem, &p_elem) ;
```

APPENDIX-continued

```
            if (level < NUM_PASSCKT_FETS - 1) {
                if (n_elem) npass_fets[level + 1] = n_elem ;
                if (p_elem) ppass_fets[level + 1] = p_elem ;
            }
            find_checklatch_driver_r(other_node, wc_node, type, wc_width, wc_loverw, ppass_fets, npass_fets,
level+1, wc_ppass_fets, wc_npass_fets, wc_levels) ;
        }
    } end_chan_fets
    if (NIsPassGateOut(node)) return ;
    fet_tree_ptr = build_generic_tree(node,type,0,&node_type_flag);
    if (fet_tree_ptr) {
        combine_shared_diffusions(fet_tree_ptr,fet_tree_ptr);
        effective_w_calc_from_tree(fet_tree_ptr, &fet_max_l_over_w, &fet_min_l_over_w, &fet_in_parallel);
        node_width = DeviceL_ReqERC / fet_max_l_over_w ;
        free_fet_tree(fet_tree_ptr,fet_tree_ptr);
    }
    else node_width = (type == NTYPE) ? CheckLatchDefaultNWidth_ReqERC :
CheckLatchDefaultPWidth_ReqERC ;
    /* The total L/W for this path depends on a weighted sum of the L/W for the pass FETs along the path. It also
depends on whether this is a pullup or pulldown path. */
    pfet_vt_drop = nfet_vt_drop = FALSE ;
    if (type == PTYPE) total_loverw = (DeviceL_ReqERC/node_width) * PMobility_ReqERC *
CheckLatchPFETPassingVDD_ReqERC ;
    else total_loverw = (DeviceL_ReqERC/node_width) * CheckLatchNFETPassingGND_ReqERC ;
    for (i = NUM_PASSCKT_FETS - 1; i > 0; i--) {
        is_npass = (npass_fets[i] != NULL) ? TRUE : FALSE ;
        is_ppass = (ppass_fets[i] != NULL) ? TRUE : FALSE ;
        if (!is_ppass && !is_npass) continue ;
        if (is_ppass) { pfet_loverw = PMobility_ReqERC * ((ppass_fets[i])—>len / (ppass_fets[i])—>wid) ; }
        if (is_npass) { nfet_loverw = (npass_fets[i])—>len / (npass_fets[i])—>wid ; }
        /* The L/W for this passfet stage depends on whether this is a pullup
            or pulldown path and on whether there has been a Vt drop along this path. */
        if (type == NTYPE) {
/* pulldown path */
pscale = pfet_vt_drop ? CheckLatchPFETPassingGND_Vt_ReqERC : CheckLatchPFETPassingGND_ReqERC ;
nscale = nfet_vt_drop ? CheckLatchNFETPassingGND_Vt_ReqERC : CheckLatchNFETPassingGND_ReqERC ;
        }
        else {
/* pullup path */
pscale = pfet_vt_drop ? CheckLatchPFETPassingVDD_Vt_ReqERC : CheckLatchPFETPassingVDD_ReqERC ;
nscale = nfet_vt_drop ? CheckLatchNFETPassingVDD_Vt_ReqERC : CheckLatchNFETPassingVDD_ReqERC ;
        }
        pfet_loverw *= pscale ;
        nfet_loverw *= nscale ;
        if (is_npass && is_ppass) { stage_loverw = (nfet_loverw * pfet_loverw) / (nfet_loverw + pfet_loverw) ; }
        else if (is_npass && !is_ppass) { stage_loverw = nfet_loverw ; }
        else { stage_loverw = pfet_loverw ; }
        total_loverw += stage_loverw ;
        /* For the next set of pass fets, remember if there has been a Vt drop. */
        if ( is_ppass && !is_npass) pfet_vt_drop |= TRUE ;
        if (!is_ppass && is_npass) nfet_vt_drop |= TRUE ;
    }
    /* If this current node is worse than the current worst offender, record the information. */
    if (total_loverw > *wc_loverw) {
        *wc_width = node_width ;
        *wc_node = node ;
        *wc_loverw = total_loverw ;
        for (i = 0; i < NUM_PASSCKT_FETS; i++) {
            wc_npass_fets[i] = npass_fets[i] ;
            wc_ppass_fets[i] = ppass_fets[i] ;
        }
        *wc_levels = level ;
    }
    /* Remove passfet information that was recorded for this level. */
    if (level < NUM_PASSCKT_FETS) {
        npass_fets[level] = ppass_fets[level] = NULL ;
    }
}
/* Given a node that is the input to a latch, traverse over any other pass FETs and determine the weakest
equivalent width FET that either pulls up or down the latch input. What is considered "weakest" has changed
over time to try to match what checklatch classic calls the "weakest" path. This routine also keeps track of all the
passfets that are encountered on the way to the worst case driver. It also keeps track of the number of passfet
levels that were found in getting to the worst case driver.*/
void find_checklatch_driver(node, wc_node, type, wc_width, wc_ppass_fets, wc_npass_fets, wc_levels)
node_pr node, *wc_node; int type, *wc_levels ; double* wc_width ; elem_pr *wc_ppass_fets,
*wc_npass_fets ;
{
    elem_pr npass_fets[NUM_PASSCKT_FETS], ppass_fets[NUM_PASSCKT_FETS] ;
    double wc_loverw = 0.0 ; int i ;
```

APPENDIX-continued

```
        for (i = 0; i < NUM_PASSCKT_FETS; i++) { npass_fets[i] = ppass_fets[i] = NULL ; }
            push_node_set_mark(node) ;
            find_checklatch_driver_r(node, wc_node, type, wc_width, &wc_loverw, ppass_fets, npass_fets, 0,
    wc_ppass_fets, wc_npass_fets, wc_levels) ;
            clear_node_marks( ) ;
}
/* Return TRUE if this node can be determined to be the feedback node of a latch structure. */
int NIsFeedBack(node)
node_pr node ;
{
    elem_pr elem ; int n_feedback = FALSE, p_feedback = FALSE ;
    if (!NIsLatch(node)) return FALSE ;
    for_gate_elems(elem, node) {
        if(EIsFeedback(elem))
            if (ETypeIsN(elem)) n_feedback = TRUE ;
            if (ETypeIsP(elem)) p_feedback = TRUE ;
    } end_gate_elems
    if (n_feedback && p_feedback) return TRUE ;
    else return FALSE ;
}
/* Write one deck with 3 circuits in it for each latch node. This is the top level routine for creating the checklatch
decks. */
check_latch_node(node)
node_pr node ;
{
    FILE *MYDECK ; elem_pr pullup_npass_fets[NUM_PASSCKT_FETS],
pullup_ppass_fets[NUM_PASSCKT_FETS] ;
    elem_pr pulldown_npass_fets[NUM_PASSCKT_FETS], pulldown_ppass_fets[NUM_PASSCKT_FETS] ;
    elem_pr elem; node_pr pdriver_node = NULL, ndriver_node = NULL ;
    double m_w[NUM_CKLATCH_FETS], m_l[NUM_CKLATCH_FETS] ; int i, lmodel[NUM_CKLATCH_FETS] ;
    int pullup_levels = 0, pulldown_levels = 0 ; char message[MAXSTRING];
    /* Skip this node if it's the output of the forward inverter. */
    if (NIsFeedBack(node)) return ;
    for (i = 0; i < NUM_CKLATCH_FETS; i++) { m_w[i] = 0.0; m_l[i] = DeviceL_ReqERC ; }
    for (i = 0; i < NUM_PASSCKT_FETS; i++) { pullup_npass_fets[i] = pullup_ppass_fets[i] =
pulldown_npass_fets[i] = pulldown_ppass_fets[i] = NULL ; }
    /* determine the fet widths and lengths for this node */
    if (find_checklatch_latchfets(node, &m_w[0], &m_l[0])) return ;
    find_checklatch_driver(node, &pdriver_node, PTYPE, &m_w[6], pullup_ppass_fets, pullup_npass_fets,
&pullup_levels) ;
    find_checklatch_driver(node, &ndriver_node, NTYPE, &m_w[5], pulldown_ppass_fets, pulldown_npass_fets,
&pulldown_levels) ;
    if (!pdriver_node || !ndriver_node) return ;
    /* The NFETS have odd transistor numbers, the PFETs have even numbers. */
    for (i = 1; i < NUM_CKLATCH_FETS; i+=2) lmodel[i] = m_l[i] > CheckLatchLongNLength_ReqERC ? TRUE :
FALSE ;
    for (i = 2; i < NUM_CKLATCH_FETS; i+=2) lmodel[i] = m_l[i] > CheckLatchLongPLength_ReqERC ? TRUE :
FALSE ;
    MYDECK = start_deck(CHECKLATCH_SIM, node);
    declare_passfet_ckt(MYDECK, "pulldown_passfet_ckt", pulldown_ppass_fets, pulldown_npass_fets ) ;
    declare_passfet_ckt(MYDECK, "pullup_passfet_ckt", pullup_ppass_fets, pullup_npass_fets ) ;
    declare_vth_ckt(MYDECK, lmodel) ;
    declare_set0_ckt(MYDECK, lmodel) ;
    declare_set1_ckt(MYDECK, lmodel) ;
    add_checklatch_comments_to_deck(MYDECK, pulldown_ppass_fets, pulldown_npass_fets,
pullup_ppass_fets,
            pullup_npass_fets, ndriver_node, pdriver_node) ;
    /* Place a message about the total number of levels */
    if ((pullup_levels >= NUM_PASSCKT_FETS) || (pulldown_levels >= NUM_PASSCKT_FETS)) {
        sprintf(message,"Model Error: Total pullup passfets %d Total pulldown passfets %d Model limit %d",
            pullup_levels, pulldown_levels, NUM_PASSCKT_FETS -1) ;
        add_comment_to_deck(MYDECK, message) ;
    }
    add_ckt_header_to_deck(MYDECK, "cktl", CHECKLATCH_QUERY) ;
    fprintf(MYDECK,"V1 100 0 dc=%.4e \n", CheckLatchSupplyVoltage_ReqERC);
    add_vth_ckt_to_deck(MYDECK, m_w, m_l) ;
    add_set0_ckt_to_deck(MYDECK, m_w, m_l) ;
    add_set1_ckt_to_deck(MYDECK, m_w, m_l) ;
    end_deck(MYDECK);
}
```

What is claimed is:

1. A method of determining a DC margin of a latch of a circuit, the circuit including one or more circuit elements, and the latch including a plurality of signal paths for gassing signals through the one or more circuit elements, the method comprising:

determining a worst case pull-up path and a worst case pull-down path analytically by accumulating a weighted resistance of each circuit element along the plurality of signal paths, wherein weights assigned to the circuit elements are empirically determined based on a topology configuration of each of the circuit elements, and wherein the topology configuration includes one or more of a type of the circuit elements, the signals being passed through the circuit elements, and whether a threshold voltage drop occurs between a drive circuit element and a pass circuit element;

performing a first simulation using a first simulation circuit to determine a trip voltage of a forward inverter of said latch;

performing a second simulation using a second simulation circuit to determine a one margin of said latch, said second simulation circuit comprising the worst case pull-up signal path; and performing a third simulation using a third simulation circuit to determine a zero margin of said latch, said third simulation circuit comprising the worst case pull-down signal path.

2. The method of determining a DC margin of a latch in accordance with claim 1, further comprising:

determining said worst case pull-up signal path analytically by comparing a cumulative weighted resistance of at least one pull-up signal path to said latch.

3. The method of determining a DC margin of a latch in accordance with claim 2, wherein said step of determining said worst case pull-up signal path comprises:

identifying one or more pass circuit elements along each of possible pull-up signal paths;

determining a resistance of each of said identified one or more pass circuit elements based on respective sizes of said identified one or more pass circuit elements;

applying to said resistance, of each of said identified one or more pass circuit elements, a weight based on topology configuration of a corresponding one of said identified one or more pass circuit elements to produce one or more weighted resistance;

summing said one or more weighted resistance to produce said cumulative weighted resistance of each of said possible pull-up signal paths; and determining said worst case pull-up signal path having a highest cumulative weighted resistance among said possible pull-up signal paths.

4. The method of determining a DC margin of a latch in accordance with claim 1, further comprising:

determining said worst case pull-down signal path analytically by comparing a cumulative weighted resistance of at least one pull-down signal path to said latch.

5. The method of determining a DC margin of a latch in accordance with claim 4, wherein said step of determining said worst case pull-down signal path comprises:

identifying one or more pass circuit elements along each of possible pull-down signal paths;

determining a resistance of each of said identified one or more pass circuit elements based on respective sizes of said identified one or more pass circuit elements;

applying to said resistance, of each of said identified one or more pass circuit elements, a weight based on topology configuration of a corresponding one of said identified one or more pass circuit elements to produce one or more weighted resistance;

summing said one or more weighted resistance to produce said cumulative weighted resistance of each of said possible pull-down signal paths; and determining said worst case pull-down signal path having a highest cumulative weighted resistance among said possible pull-down signal paths.

6. The method of determining a DC margin of a latch in accordance with claim 1, wherein said step of performing said second simulation comprises:

setting an initial value of an output, of a portion of said second simulation circuit representing said latch, to a logical high;

applying a logical high pull-up input signal to an input, of said portion of said second simulation circuit representing said latch, through said worst case pull-up signal path; and determining a voltage level at said input.

7. The method of determining a DC margin of a latch in accordance with claim 1, wherein said step of performing said third simulation comprises:

setting an initial value of an output, of a portion of said third simulation circuit representing said latch, to a logical low;

applying a logical low pull-down input signal to an input, of said portion of said third simulation circuit representing said latch, through said worst case pull-down signal path; and determining a voltage level at said input.

8. A computer readable storage medium having stored thereon computer program for implementing a method of determining a DC margin of a latch of a circuit, the circuit including one or more circuit elements, and the latch including a plurality of signal paths for passing signals through the one or more circuit elements, said computer program comprising a set of instructions for:

determining a worst case pull-up path and a worst case pull-down path analytically by accumulating a weighted resistance of each circuit element along the plurality of signal paths, wherein weights assigned to the circuit elements are empirically determined based on a topology configuration of each of the circuit elements, and wherein the topology configuration includes one or more of a type of the circuit elements, the signals being passed through the circuit elements, and whether a threshold voltage drop occurs between a drive circuit element and a pass circuit element;

performing a first simulation using a first simulation circuit to determine a trip voltage of a forward inverter of said latch;

performing a second simulation using a second simulation circuit to determine a one margin of said latch, said second simulation circuit comprising the worst case pull-up signal path; and performing a third simulation using a third simulation circuit to determine a zero margin of said latch, said third simulation circuit comprising the worst case pull-down signal path.

9. The computer readable storage medium according to claim 8, wherein said computer program further comprising one or more instructions for:

determining said worst case pull-up signal path analytically by comparing a cumulative weighted resistance of at least one pull-up signal path to said latch.

10. The computer readable storage medium according to claim 9, wherein said computer program further comprising one or more instructions for:

identifying one or more pass circuit elements along each of possible pull-up signal paths;

determining a resistance of each of said identified one or more pass circuit elements based on respective sizes of said identified one or more pass circuit elements;

applying to said resistance, of each of said identified one or more pass circuit elements, a weight based on topology configuration of a corresponding one of said identified one or more pass circuit elements to produce one or more weighted resistance;

summing said one or more weighted resistance to produce said cumulative weighted resistance of each of said possible pull-up signal paths; and determining said worst case pull-up signal path having a highest cumulative weighted resistance among said possible pull-up signal paths.

11. The computer readable storage medium according to claim 8, wherein said computer program further comprising one or more instructions for:

determining said worst case pull-down signal path analytically by comparing a cumulative weighted resistance of at least one pull-down signal path to said latch.

12. The computer readable storage medium according to claim 11, wherein said computer program further comprising one or more instructions for:

identifying one or more pass circuit elements along each of possible pull-down signal paths;

determining a resistance of each of said identified one or more pass circuit elements based on respective sizes of said identified one or more pass circuit elements;

applying to said resistance, of each of said identified one or more pass circuit elements, a weight based on topology configuration of a corresponding one of said identified one or more pass circuit elements to produce one or more weighted resistance;

summing said one or more weighted resistance to produce said cumulative weighted resistance of each of said possible pull-down signal paths; and determining said worst case pull-down signal path having a highest cumulative weighted resistance among said possible pull-down signal paths.

13. The computer readable storage medium according to claim 8, wherein said one or more instructions for performing said second simulation comprises one or more instructions for:

setting an initial value of an output, of a portion of said second simulation circuit representing said latch, to a logical high;

applying a logical high pull-up input signal to an input, of said portion of said second simulation circuit representing said latch, through said worst case pull-up signal path; and determining a voltage level at said input.

14. The computer readable storage medium according to claim 8, wherein said one or more instructions for performing said third simulation comprises one or more instructions for:

setting an initial value of an output, of a portion of said second simulation circuit representing said latch, to a logical low;

applying a logical low pull-down input signal to an input, of said portion of said second simulation circuit representing said latch, through said worst case pull-down signal path; and determining a voltage level at said input.

15. A simulation circuit for determining a DC margin of a latch of a circuit, the circuit including one or more circuit elements, and the latch including a plurality of signal paths for passing signals through the one or more circuit elements, comprising:

a latch portion representing said latch being simulated, said latch portion comprising a forward inverter and a feedback inverter, an input of said forward inverter being operably connected to an input of said latch portion, and an input of said feedback inverter being operably connected to an output of said latch portion;

a driver portion representing a driver circuit element capable of supplying an input signal to said latch being simulated; and a pass path subcircuit configured to receive a drive signal from said driver portion, and configured to supply said drive signal to said input of said latch portion, said pass path subcircuit representing one or more pass circuit elements along a worst case signal path between said driver circuit element and said latch being simulated, wherein the worst case signal path is determined analytically by accumulating a weighted resistance of each circuit element along the plurality of signal paths, wherein weights assigned to the circuit elements are empirically determined based on a topology configuration of each of the circuit elements, and wherein the topology configuration includes one or more of a type of the circuit elements, the signals being passed through the circuit elements, and whether a threshold voltage drop occurs between a drive circuit element and a pass circuit element.

16. The simulation circuit according to claim 15, wherein each of said forward inverter and said feedback inverter comprises:

a complementary pair of field effect transistors.

17. The simulation circuit according to claim 15, wherein said pass path subcircuit comprises:

one or more field effect transistors.

18. The simulation circuit according to claim 17, wherein:

at least two of said one or more field effect transistors are arranged as a complementary pair.

19. The simulation circuit according to claim 17, wherein:

each of said one or more field effect transistors representing corresponding one of said one or more pass circuit elements along a worst case signal path between said driver circuit element and said latch being simulated; and wherein sizes of said one or more field effect transistors are chosen based on respective resistance of corresponding ones of said one or more pass circuit element.

* * * * *